(12) United States Patent
Pritchard et al.

(10) Patent No.: US 11,758,644 B2
(45) Date of Patent: Sep. 12, 2023

(54) SLOTTED VIAS FOR CIRCUIT BOARDS

(71) Applicant: Dell Products L.P., Round Rock, TX (US)

(72) Inventors: Jason Pritchard, Hopkinton, MA (US); Charles W. Ziegler, IV, Framingham, MA (US); Qianwen Wang, Shanghai (CN); Lingyu Kong, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 218 days.

(21) Appl. No.: 17/319,577

(22) Filed: May 13, 2021

(65) Prior Publication Data

US 2022/0369452 A1 Nov. 17, 2022

(51) Int. Cl.
*H05K 1/02* (2006.01)
*H05K 1/11* (2006.01)

(52) U.S. Cl.
CPC . *H05K 1/0222* (2013.01); *H05K 2201/09618* (2013.01); *H05K 2201/09636* (2013.01)

(58) Field of Classification Search
CPC ...... H05K 1/0222; H05K 1/115; H05K 1/116; H05K 2201/09618; H05K 2201/09636; H05K 2201/049; H05K 7/1439
See application file for complete search history.

(56) References Cited

U.S. PATENT DOCUMENTS

| | | | | |
|---|---|---|---|---|
| 2016/0150645 A1* | 5/2016 | Gailus | ................ | H05K 3/0047 174/262 |
| 2017/0318664 A1* | 11/2017 | Marechal | ............. | H05K 1/0251 |
| 2021/0315096 A1* | 10/2021 | Matsubara | ............ | H05K 1/113 |
| 2022/0192007 A1* | 6/2022 | Li | .......................... | H05K 1/115 |
| 2022/0272834 A1* | 8/2022 | Westwood | ......... | G01R 31/2889 |
| 2022/0418094 A1* | 12/2022 | Nitta | ..................... | H05K 1/024 |
| 2023/0019563 A1* | 1/2023 | Nitta | ........................ | H05K 9/00 |

\* cited by examiner

*Primary Examiner* — Hoa C Nguyen
*Assistant Examiner* — Amol H Patel
(74) *Attorney, Agent, or Firm* — Jackson Walker L.L.P

(57) ABSTRACT

A circuit board may include a traditional via electrically coupled to a first layer of the circuit board and coupled to a second layer of the circuit board and a slotted via formed within the circuit board proximate to the traditional via, the slotted via comprising an opening through a first surface and a second surface of the circuit board and a layer of conductive material formed on interior walls of the opening.

20 Claims, 4 Drawing Sheets

SLOTTED VIAS FOR CIRCUIT BOARDS

TECHNICAL FIELD

The present disclosure relates in general to information handling systems, and more particularly to systems and methods for providing slotted vias for circuit boards.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include one or more circuit boards operable to mechanically support and electrically couple electronic components making up the information handling system. For example, circuit boards may be used as part of motherboards, memories, storage devices, storage device controllers, peripherals, peripheral cards, network interface cards, and/or other electronic components. As is known in the art, a circuit board may comprise a plurality of conductive layers separated and supported by layers of insulating material laminated together, with conductive traces disposed on and/or in any of such conductive layers.

A circuit board may have numerous electrically-conductive conduits, including traces, vias, pads, and/or other electrically-conductive conduits. A via may comprise a substantially electrically conductive material and may be formed such that vias may electrically couple together traces on different layers of circuit board, thus allowing signals to propagate between layers of circuit board.

Circuit board vias may be a source of unwanted noise, impedance discontinuities, and electromagnetic interference. Typical signal via transitions often use local ground vias to control the impedance noise and minimize coupling to neighboring signal vias. The number and location of ground vias may be limited by circuit board design rules. Accordingly, other approaches for providing control of impedance noise and minimizing coupling may be desirable.

SUMMARY

In accordance with the teachings of the present disclosure, the disadvantages and problems associated with existing circuit board techniques may be reduced or eliminated.

In accordance with embodiments of the present disclosure, a circuit board may include a traditional via electrically coupled to a first layer of the circuit board and coupled to a second layer of the circuit board, and a slotted via formed within the circuit board proximate to the traditional via, the slotted via comprising an opening through a first surface and a second surface of the circuit board and a layer of conductive material formed on interior walls of the opening.

In accordance with these and other embodiments of the present disclosure, a method may include electrically coupling a traditional via to a first layer of a circuit board and a second layer of the circuit board and forming a slotted via within the circuit board proximate to the traditional via, the slotted via comprising an opening through a first surface and a second surface of the circuit board and a layer of conductive material formed on interior walls of the opening.

In accordance with these and other embodiments of the present disclosure, an information handling system may include an enclosure and a circuit board housed in the enclosure, the circuit board comprising a traditional via electrically coupled to a first layer of the circuit board and coupled to a second layer of the circuit board, and a slotted via formed within the circuit board proximate to the traditional via, the slotted via comprising an opening through a first surface and a second surface of the circuit board and a layer of conductive material formed on interior walls of the opening.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
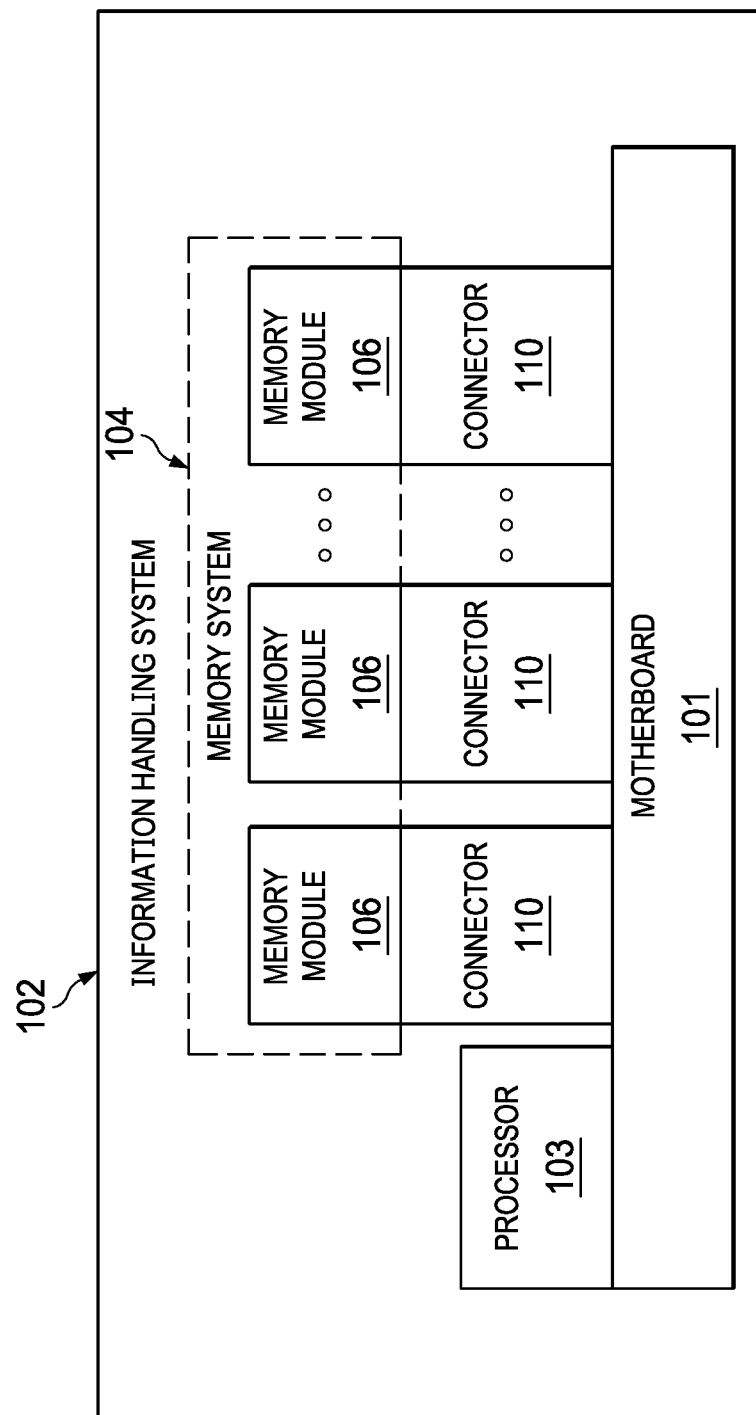
FIG. 1 illustrates a block diagram of an example information handling system, in accordance with embodiments of the present disclosure.

Preferred embodiments and their advantages are best understood by reference to FIGS. 1 through 4B, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

As discussed above, an information handling system may include one or more circuit boards operable to mechanically support and electrically connect electronic components making up the information handling system (e.g., packaged integrated circuits). Circuit boards may be used as part of motherboards, memories, storage devices, storage device controllers, peripherals, peripheral cards, network interface cards, and/or other electronic components. As used herein, the term "circuit board" includes printed circuit boards (PCBs), printed wiring boards (PWBs), etched wiring boards, and/or any other board or similar physical structure operable to mechanically support and electrically couple electronic components.

FIG. 1 illustrates a block diagram of an example information handling system 102, in accordance with embodiments of the present disclosure. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a motherboard 101, a processor 103 coupled to motherboard 101, a plurality of connectors 110 mechanically and electrically coupled to motherboard 101, and memory system 104 comprising a plurality of memory modules 106 each electrically coupled to motherboard 101 via a respective connector 110. Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory system 104 may be communicatively coupled to processor 103 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may be implemented by a plurality of memory modules 106 removably coupled to connectors 110. Each memory module 106 may include any system, device or apparatus configured to retain program instructions and/or data for a period of time (e.g., computer-readable media). A memory module 106 may comprise a dual in-line package (DIP) memory, a dual-inline memory module (DIMM), a Single In-line Pin Package (SIPP) memory, a Single Inline Memory Module (SIMM), a Ball Grid Array (BGA), or any other suitable memory module. In some embodiments, a memory module 106 may include a mating edge connector configured to mechanically and electrically couple to a corresponding receptacle slot or other opening of a connector 110. In some embodiments, a memory module 106 may be implemented using a circuit board.

A connector 110 may comprise any system, device, or apparatus fixedly mounted on motherboard 101 and may be constructed to mechanically couple a corresponding memory module 106 to motherboard 101 and to electrically couple such memory module 106 to motherboard 101, processor 103, and/or other components of information handling system 102. Connector 110 may comprise a socket including a receptacle slot or other opening configured to removably receive a corresponding mating edge connector of a memory module 106.

In addition to motherboard 101, processor 103, connectors 110, and memory modules 106, information handling system 102 may include one or more other information handling resources.

Figure 2:
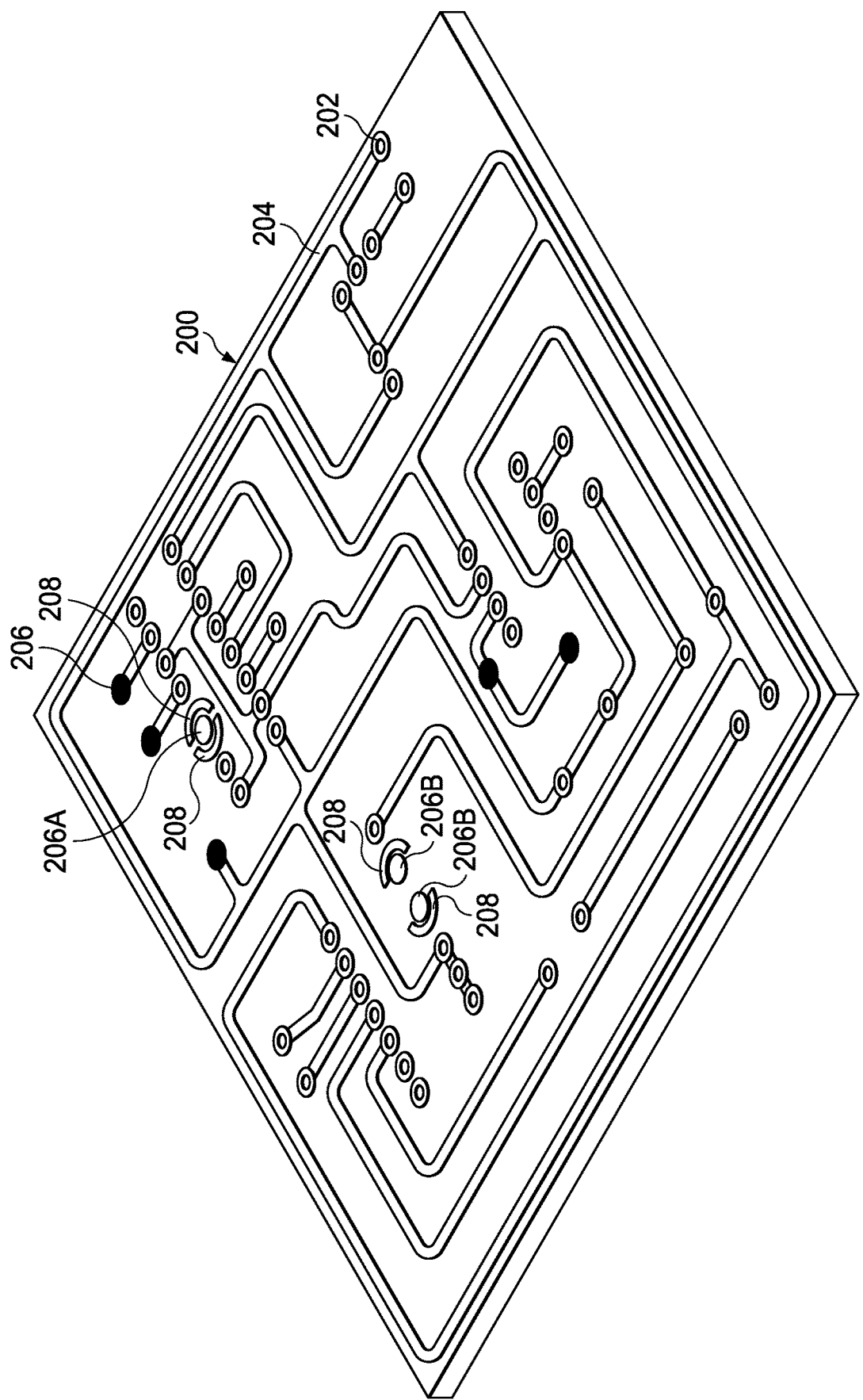
FIG. 2 illustrates a perspective view of an example circuit board, in accordance with embodiments of the present disclosure.

FIG. 2 illustrates a perspective view of an example circuit board 200, in accordance with embodiments of the present disclosure. Circuit board 200 or a circuit board similar to circuit board 200 may be used to implement at least a portion of motherboard 101, a memory module 106, and/or other information handling resources of information handling system 102. As depicted in FIG. 2, circuit board 200 may include a plurality of pads 202, traces 204, traditional vias 206, and slotted vias 208. Pads 202 may comprise a conductive material and may be formed on a surface of circuit board 200. Further, each pad 202 may be operable to receive a pin of an electronic component (e.g., a packaged integrated circuit) and provide electrical connectivity between the pin and one or more traces 204. Traces 204 may comprise a conductive material and may be formed on a surface of circuit board 200, or in a layer of circuit board 200 not visible from the surface thereof. Further, each trace 204 may be operable to provide conductive pathways between electronic components mounted to pads 202.

Although FIG. 2 depicts pads 202 and traces 204 on the top surface of circuit board 200 visible in FIG. 2, it is understood that pads 202 and traces 204 may also be disposed on the bottom surface of circuit board 200. In addition, circuit board 200 may comprise a plurality of conductive layers separated and supported by layers of insulating material laminated together, and traces 204 may be disposed on and/or in any of such conductive layers. Connectivity between pads 202 and/or traces 204 disposed on and/or in various layers of circuit board 200 may be provided by traditional vias 206.

As described in greater detail below, a slotted via 208 may be formed in an opening through circuit board 200 with the interior walls of the opening having conductive material formed thereon (e.g., plated), thus creating a conductive pathway. In some embodiments, such conductive material formed within the opening may be coupled to a ground plane (or a power plane) in a layer of circuit board 200 such that the conductive material is maintained during operation at a plane voltage (e.g., ground voltage or power rail voltage). Accordingly, a slotted via 208 may provide electromagnetic shielding of a traditional via 206. For example, a single slotted via 208 may be used to partially shield a traditional via 206A carrying a single-ended signal or a pair of slotted vias 208 may be used to almost fully shield a traditional via 206A carrying a single-ended signal, such that the traditional via 206A and the pair of slotted vias 208 shielding the traditional via 206A electrically mimic a coaxial cable. As another example, a pair of slotted vias 208 may be used to almost fully shield a pair of traditional vias 206B carrying a differential signal.

The various pads 202, traces 204, traditional vias 206, and slotted vias 208 may comprise silver, copper, aluminum, lead, nickel, other metals, metal alloys, and/or any other conductive material that may readily conduct electrical current.

Figure 3A:
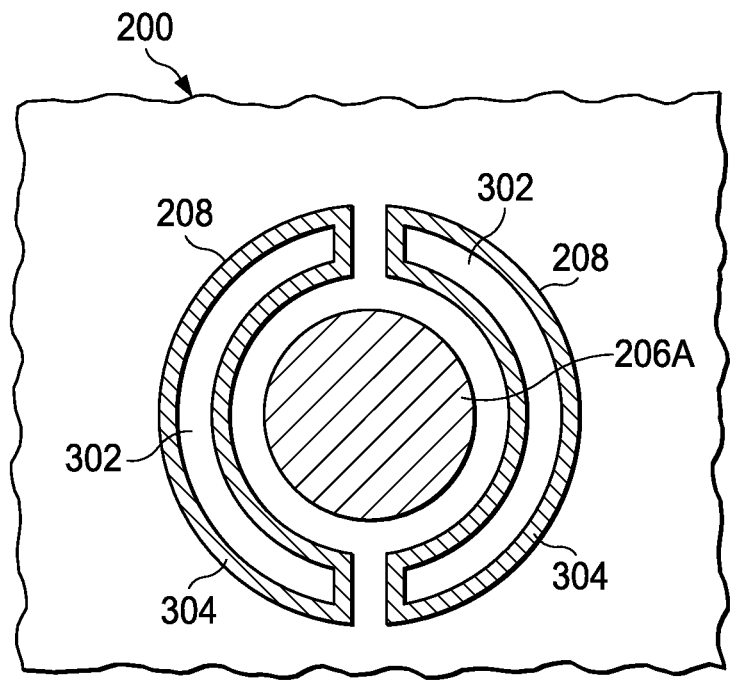
FIG. 3A illustrates a plan view of a portion of a top surface of an example circuit board comprising a single traditional via shielded by a pair of slotted vias, in accordance with embodiments of the present disclosure.
Figure 3B:
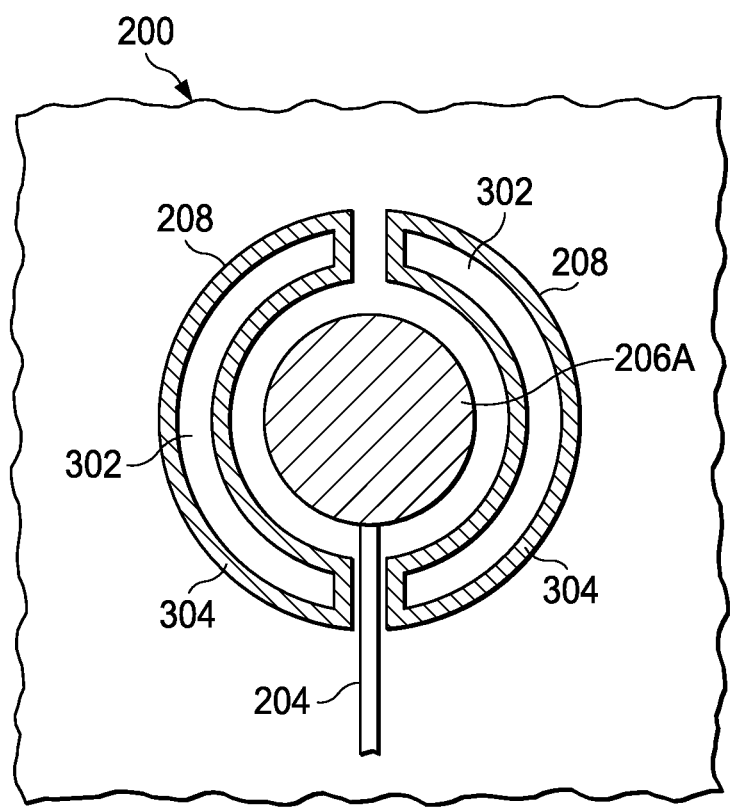
FIG. 3B illustrates a plan view of a corresponding portion of a bottom surface of the example circuit board shown in FIG. 3A, in accordance with embodiments of the present disclosure.

FIG. 3A illustrates a plan view of a portion of a top surface of example circuit board 200 comprising a single traditional via 206A (e.g., which may carry a single-ended signal) shielded by a pair of slotted vias 208, in accordance with embodiments of the present disclosure. FIG. 3B illustrates a plan view of a corresponding portion of a bottom surface of example circuit board 200 shown in FIG. 3A, in accordance with embodiments of the present disclosure.

Figure 4A:
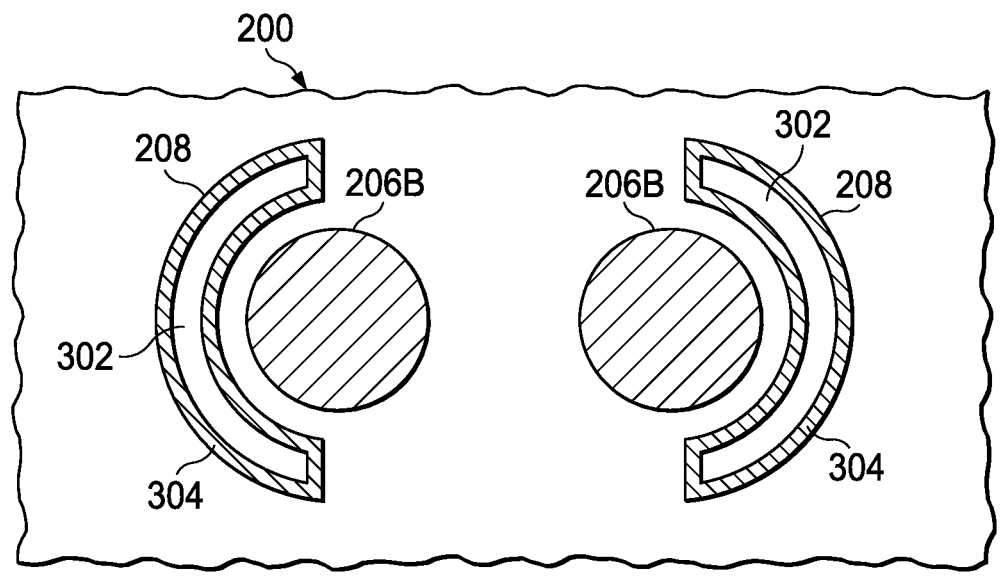
FIG. 4A illustrates a plan view of a portion of a top surface of an example circuit board comprising a pair of traditional vias shielded by a pair of slotted vias, in accordance with embodiments of the present disclosure.
Figure 4B:
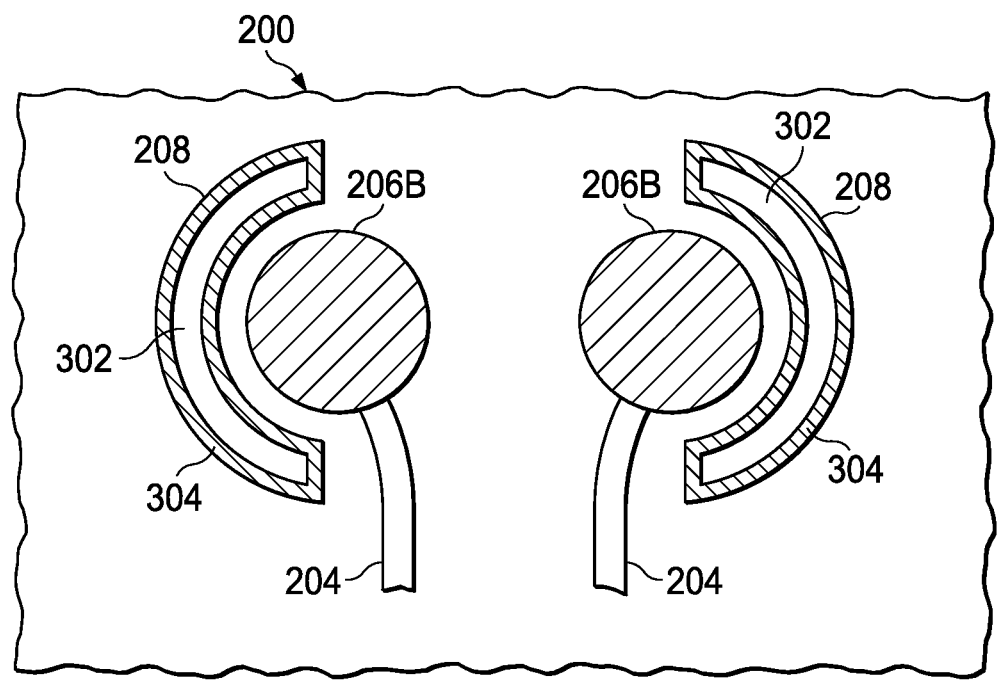
FIG. 4B illustrates a plan view of a corresponding portion of a bottom surface of the example circuit board shown in FIG. 4A, in accordance with embodiments of the present disclosure.

Similarly, FIG. 4A illustrates a plan view of a portion of a top surface of example circuit board 200 comprising a pair of traditional vias 206B (e.g., which may carry a differential signal) shielded by a pair of slotted vias 208, in accordance with embodiments of the present disclosure. FIG. 4B illustrates a plan view of a corresponding portion of a bottom surface of example circuit board 200 shown in FIG. 4A, in accordance with embodiments of the present disclosure.

As shown in FIGS. 3A, 3B, 4A, and 4B, a slotted via 208 may comprise an opening 302 formed through both the top and bottom surfaces of circuit board 200, with the interior walls of the opening having conductive material 304 formed thereon (e.g., a thin sheet of conductive metal plated thereon). In some embodiments, such conductive material 304 formed within the opening 302 may be coupled to a ground plane (or a power plane) in a layer of circuit board 200 such that the conductive material 304 is maintained during operation at a plane voltage (e.g., ground voltage or power rail voltage). Accordingly, a slotted via 208 may provide electromagnetic shielding of a traditional via 206 (e.g., traditional vias 206A and 206B).

Although FIGS. 2, 3A, 3B, 4A, and 4B show slotted vias 208 being generally C-shaped, it is understood that slotted vias 208 may have any suitable shape.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A circuit board, comprising:
    a traditional via, including a circular upper surface, electrically coupled to a first layer of the circuit board and coupled to a second layer of the circuit board; and
    a slotted via formed within the circuit board proximate, but not connected, to the traditional via, the slotted via comprising:
        a C-shaped opening through a first surface and a second surface of the circuit board; and
        a layer of conductive material formed on interior walls of the opening;
        wherein the C-shaped opening of the slotted via and the circular upper surface of the traditional via are concentric and wherein the C-shaped opening provides at least partial electromagnetic shielding of the traditional via.

2. The circuit board of claim 1, further comprising a second slotted via formed within the circuit board proximate to the traditional via, the second slotted via comprising:
    a second C-shaped opening through the first surface and the second surface; and
    a second layer of conductive material formed on interior walls of the second opening, wherein the second C-shaped opening of the second slotted via, the C-shaped opening of the first slotted via, and the circular upper surface of the traditional via are concentric.

3. The circuit board of claim 2, wherein the first and second C-shaped openings are symmetrically positioned on opposing sides of the circular traditional via.

4. The circuit board of claim 1, further comprising:
    a second traditional via; and
    a second slotted via formed within the circuit board proximate to the second traditional via, the second slotted via comprising:
        a second C-shaped opening through the first surface and the second surface; and
        a second layer of conductive material formed on interior walls of the second opening;
        wherein the second C-shaped opening of the second slotted via and the second traditional via are concentric.

5. The circuit board of claim 1, wherein the layer of conductive material is electrically coupled to a reference plane of a layer of the circuit board.

6. The circuit board of claim 5, wherein the reference plane carries a ground voltage.

7. The circuit board of claim 5, wherein the reference plane carries a rail voltage.

8. The circuit board of claim 1, wherein the C-shaped opening defines an inner arc and an outer arc and wherein inner arc, the outer arc, and the circular upper surface of the traditional via are concentric.

9. A method, comprising:
    electrically coupling a traditional via to a first layer of a circuit board and to a second layer of the circuit board; and
    forming a slotted via within the circuit board proximate, but not connected, to the traditional via, the slotted via comprising:
        a C-shaped opening through a first surface and a second surface of the circuit board; and
        a layer of conductive material formed on interior walls of the opening;
        wherein the C-shaped opening of the slotted via and the circular upper surface of the traditional via are concentric and wherein the C-shaped opening provides at least partial electromagnetic shielding of the traditional via.

10. The method of claim 9, further comprising forming a second slotted via within the circuit board proximate to the traditional via, the second slotted via comprising:
    a second C-shaped opening through the first surface and the second surface; and
    a second layer of conductive material formed on interior walls of the second opening, wherein the second C-shaped opening of the second slotted via, the C-shaped opening of the first slotted via, and the circular upper surface of the traditional via are concentric.

11. The method of claim 9, further comprising:
    forming a second traditional via in the circuit board; and
    forming a second slotted via within the circuit board proximate to the second traditional via, the second slotted via comprising:
        a second C-shaped opening through the first surface and the second surface; and
        a second layer of conductive material formed on interior walls of the second opening;
        wherein the second C-shaped opening of the second slotted via and the second traditional via are concentric.

12. The method of claim 9, further comprising electrically coupling the layer of conductive material to a reference plane of a layer of the circuit board.

13. The method of claim 12, wherein the reference plane carries a ground voltage.

14. The method of claim 12, wherein the reference plane carries a rail voltage.

15. An information handling system comprising:
    an enclosure; and
    a circuit board housed in the enclosure, the circuit board comprising:
        a traditional via, including a circular upper surface, electrically coupled to a first layer of the circuit board and coupled to a second layer of the circuit board; and
        a slotted via formed within the circuit board proximate, but not connected, to the traditional via, the slotted via comprising:
            a C-shaped opening through a first surface and a second surface of the circuit board; and a layer of conductive material formed on interior walls of the opening;

wherein the C-shaped opening of the slotted via and the circular upper surface of the traditional via are concentric and wherein the C-shaped opening provides at least partial electromagnetic shielding of the traditional via.

16. The information handling system of claim 15, further comprising a second slotted via formed within the circuit board proximate to the traditional via, the second slotted via comprising:

a second C-shaped opening through the first surface and the second surface; and a second layer of conductive material formed on interior walls of the second opening, wherein the second C-shaped opening of the second slotted via, the C-shaped opening of the first slotted via, and the circular upper surface of the traditional via are concentric.

17. The information handling system of claim 15, further comprising:

a second traditional via; and a second slotted via formed within the circuit board proximate to the second traditional via, the second slotted via comprising:

a second C-shaped opening through the first surface and the second surface; and a second layer of conductive material formed on interior walls of the second opening;

wherein the second C-shaped opening of the second slotted via and the second traditional via are concentric.

18. The information handling system of claim 15, wherein the layer of conductive material is electrically coupled to a reference plane of a layer of the circuit board.

19. The information handling system of claim 18, wherein the reference plane carries a ground voltage.

20. The information handling system of claim 18, wherein the reference plane carries a rail voltage.

* * * * *